(12) United States Patent  (10) Patent No.: US 8,976,605 B2
Ryu  (45) Date of Patent: Mar. 10, 2015

(54) HIGH VOLTAGE GENERATION CIRCUIT AND SEMICONDUCTOR DEVICE INCLUDING THE SAME

(75) Inventor: Je Il Ryu, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 211 days.

(21) Appl. No.: 13/549,892

(22) Filed: Jul. 16, 2012

(65) Prior Publication Data

US 2013/0051159 A1    Feb. 28, 2013

(30) Foreign Application Priority Data

Aug. 26, 2011   (KR) .................. 10-2011-0085601

(51) Int. Cl.
G11C 7/00 (2006.01)
G05F 3/02 (2006.01)
G11C 5/14 (2006.01)
G11C 8/08 (2006.01)

(52) U.S. Cl.
CPC ...... *G11C 5/145* (2013.01); *G11C 7/00* (2013.01); *G11C 8/08* (2013.01)
USPC .............................. 365/189.07; 365/189.11

(58) Field of Classification Search
USPC .................. 365/189.07, 189.11; 327/536
See application file for complete search history.

(56) References Cited

U.S. PATENT DOCUMENTS

| 5,767,735 A * | 6/1998 | Javanifard et al. ............. 327/536 |
| 7,274,248 B2 * | 9/2007 | Okamoto ...................... 327/536 |
| 7,956,673 B2 * | 6/2011 | Pan ................................. 327/530 |
| 8,040,736 B2 * | 10/2011 | Kwak ....................... 365/185.23 |
| 8,127,998 B2 * | 3/2012 | Kozuma et al. ................. 235/492 |

FOREIGN PATENT DOCUMENTS

KR   100149220 B1   6/1998

* cited by examiner

*Primary Examiner* — Hoai V Ho
*Assistant Examiner* — Tri Hoang
(74) *Attorney, Agent, or Firm* — William Park & Associates Patent Ltd.

(57) ABSTRACT

A high voltage generation circuit includes a plurality of pumps configured to generate a final pump voltage, a plurality of switches configured to couple the pumps to various nodes, a voltage division circuit configured to divide the final pump voltage from the pumps interconnected by the switches, and outputting a divided voltage, a section signal generation circuit configured to generate a plurality of section signals by comparing the divided voltage with each of different reference voltages, and a section signal combination circuit configured to generate enable signals for controlling the switches by combining the section signals.

26 Claims, 6 Drawing Sheets

FIRST SECTION

SECOND SECTION

THIRD SECTION

HIGH VOLTAGE GENERATION CIRCUIT AND SEMICONDUCTOR DEVICE INCLUDING THE SAME

CROSS-REFERENCE TO RELATED APPLICATION

Priority is claimed to Korean patent application number 10-2011-0085601 filed on Aug. 26, 2011, the entire disclosure of which is incorporated by reference.

BACKGROUND

Exemplary embodiments relate to a power source and, more particularly, to a high voltage generation circuit and a semiconductor device including the same, in which voltage to be outputted rapidly reaches a target level.

A semiconductor device includes a high voltage generation circuit for generating voltage of a high level (hereinafter referred to as a high voltage). The high voltage generation circuit includes a plurality of pump pumps coupled in series in order to raise the level of a power source voltage. That is, the first pump raises the power source voltage to a first level, and a next pump raises the voltage of the first level to voltage of a second level. In this manner, an output voltage is raised up to a target level. However, the voltage rise time is slow because voltage having the target level has to be outputted by sequentially operating the pumps coupled in series. Accordingly, with an increase in a target level of voltage to be outputted (with an increase of loading), the time taken to output voltage having the target level and current necessary to generate the voltage having the target level are increased.

BRIEF SUMMARY

Exemplary embodiments relate to reducing the time taken for an output voltage to reach a target level and reducing current consumption while the output voltage of the target level is generated by using a configuration of pumps in a parallel mode, or a series/parallel mixed mode according to the level of the output voltage.

A high voltage generation circuit according to an aspect of the present disclosure includes a plurality of pumps configured to generate a final pump voltage, a plurality of switches configured to couple the pumps to various nodes, a voltage division circuit configured to divide the final pump voltage from the pumps interconnected by the switches, and outputting a divided voltage, a section signal generation circuit configured to generate a plurality of section signals by comparing the divided voltage with each of different reference voltages, and a section signal combination circuit configured to generate enable signals for controlling the switches by combining the section signals.

A high voltage generation circuit according to another aspect of the present disclosure includes a high voltage output circuit configured to include a plurality of pumps and a plurality of switches for coupling the pumps in a series, parallel, or series/parallel mode, a voltage division circuit configured to divide a final pump voltage of the pumps and output a divided voltage, and an enable signal control circuit configured to compare the divided voltage with each of a first reference voltage, a second reference voltage higher than the first reference voltage, and a third reference voltage higher than the second reference voltage and to generate a first group of enable signals, a second group of enable signals, or a third group of enable signals for controlling the switches according to a combination of signals generated as a result of the comparison.

A semiconductor device according to yet another aspect of the present disclosure includes a memory cell array configured to store data; a row decoder coupled to word lines of the memory cell array; a high voltage generation circuit configured to couple a plurality of pumps in various combinations according to a level of a divided voltage obtained by dividing a final pump voltage of the plurality of pumps and output an output voltage to the row decoder; page buffers coupled to the bit lines of the memory cell array; a column selector configured to select the page buffers; an I/O circuit configured to transfer data to the column selector and to externally output received data; and a control circuit configured to control the high voltage generation circuit, the page buffers, the column selector, and the I/O circuit.

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the embodiments of the disclosure.

Figure 1:
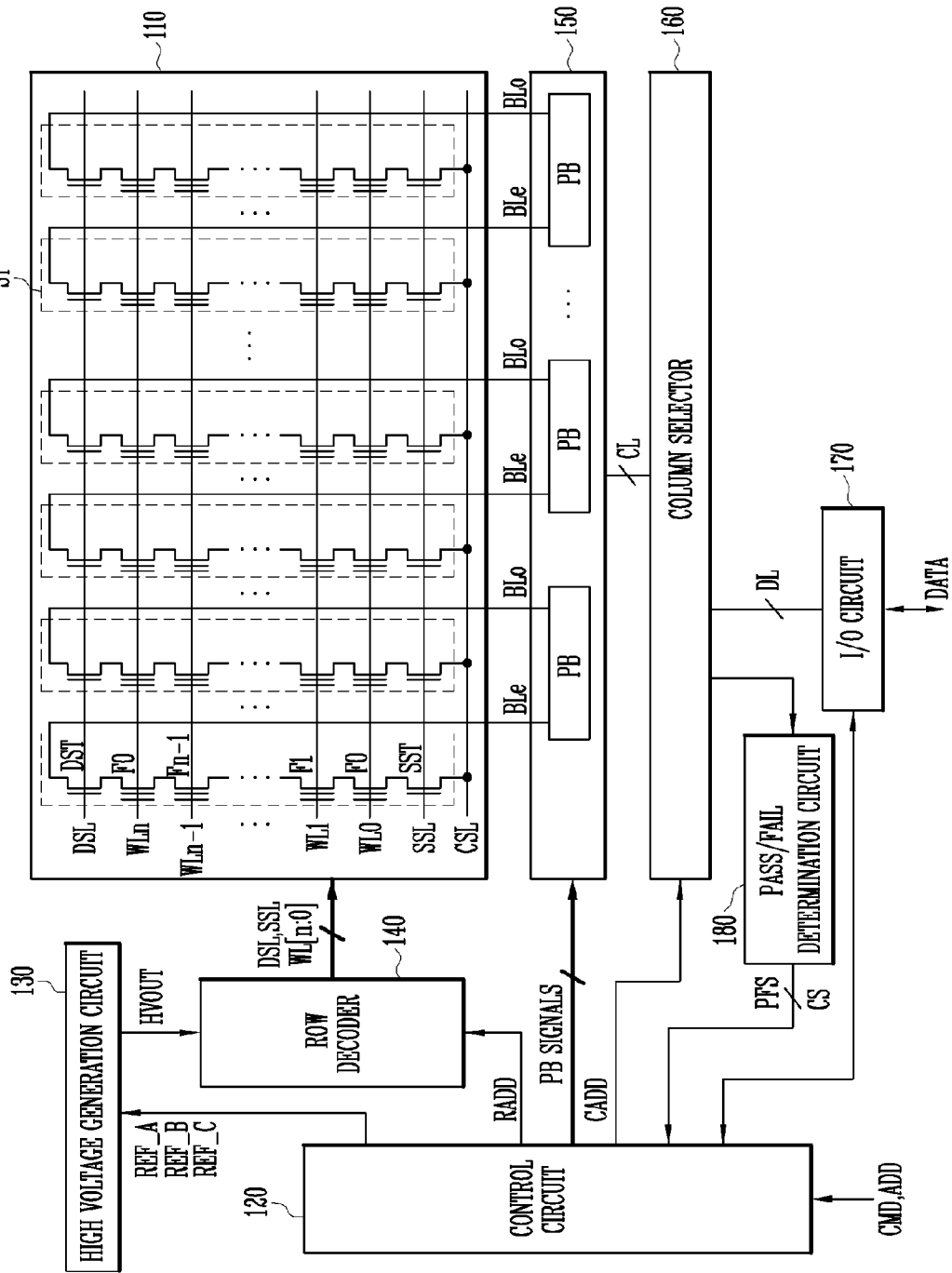
FIG. 1 is an exemplary block diagram of a semiconductor device according to an embodiment of the invention.

FIG. 1 is an exemplary block diagram of a semiconductor device according to this disclosure.

Referring to FIG. 1, the semiconductor device includes a memory cell array 110, a circuit group 130, 140, 150, 160, 170, and 180 configured to perform a program operation or a read operation for memory cells included in the memory cell array 110, and a control circuit 120 configured to control the circuit group 130, 140, 150, 160, 170, and 180 in order to set threshold voltage levels of selected memory cells according to inputted data.

In the case of a NAND flash memory device, the circuit group includes a high voltage generation circuit 130, a row decoder 140, a page buffer group 150, a column selector 160, an input/output (I/O) circuit 170, and a pass/fail determination circuit 180.

The memory cell array 110 may include a plurality of memory blocks, but only one of the memory blocks is shown in FIG. 1. The memory cell array 110 includes a plurality of strings ST, where each string ST may be considered to be one of a vertical column of transistors. Some of the strings ST are designated as normal strings, and some of the strings ST are designated as flag strings. The strings ST have the same configuration. Each of the strings ST includes a source select transistor SST coupled to a common source line CSL, a plurality of memory cells F0 to Fn, and a drain select transistor DST coupled to a bit line BLe or BLo. Cells included in the flag string are called flag cells, but they have the same construction as memory cells. The gate of the source select transistor SST is coupled to a source select line SSL. The gates of the memory cells F0 to Fn are coupled to respective word lines WL0 to WLn. The gate of the drain select transistor DST is coupled to a drain select line DSL. The strings ST are coupled to the respective bit lines BLe and BLo and coupled to the common source line CSL.

The control circuit 120 controls various operations. Some of these operations may comprise supplying erase pulses to memory cells in the memory cell array 110 and an erase verify operation of determining whether the threshold voltages of the memory cells have risen to a target erase voltage through the page buffer group 150. Anther operations may be a pre-program operation for memory cells having threshold voltages risen to the target erase voltage if there are memory cells having threshold voltages risen to the target erase voltage and memory cells having threshold voltages not risen to the target erase voltage as a result of the erase verify operation. Others may comprise an operation of supplying erase pulses until the threshold voltages of all the memory cells rise to the target erase voltage after the pre-program operation, an erase verify operation, and a pre-program operation are repeated.

The control circuit 120 generates first to third reference voltages REF_A, REF_B, and REF_C necessary to output voltages in a program, read, or erase operation and outputs page buffer signals PB SIGNALS for controlling the page buffers PB of the page buffer group 150 according in the various operations in response to a command signal CMD. The control circuit 120 generates a row address signal RADD and a column address signal CADD in response to an address signal ADD. Furthermore, the control circuit 120 checks whether the threshold voltages of selected memory cells have risen to a target voltage in response to the check signal CS of the pass/fail determination circuit 180 in a program or erase verify operation, and determines whether to perform the program or erase operation again or whether the program or erase verify operation has completed or failed.

The high voltage generation circuit 130 outputs voltage HVOUT (also called a final pump voltage or a high voltage) for programming, reading, or erasing memory cells to global lines in response to the first to third reference voltages REF_A, REF_B, and REF_C outputted by the control circuit 120. In particular, the high voltage generation circuit 130 includes a plurality of pumps for outputting a high voltage. The high voltage generation circuit 130 changes the pumps in a series mode, a parallel mode, or a series/parallel mixed mode according to a level of the final pump voltage HVOUT.

The row decoder 140 transfers the high voltage of the voltage generation circuit 130 to the local lines DSL, SSL, and WL[n:0] of a selected memory block of the memory cell array 110 in response to the row address signals RADD of the control circuit 120.

The page buffer group 150 detects the program state or the erase state of memory cells. The page buffer group 150 includes page buffers PB each coupled to the bit lines BLe and BLo. The page buffer group 150 supplies voltage necessary to store data in the memory cells F0 to Fn to the bit lines BLe and BLo in response to the page buffer signals PB SIGNALS of the control circuit 120.

More particularly, the page buffer group 150 precharges the bit lines BLe and BLo in the program operation, the erase operation, or the read operation of the memory cells F0 to Fn or latches data corresponding to the threshold voltages of the memory cells F0 to Fn which are detected according to a change in the voltages of the bit lines BLe and BLo. That is, the page buffer group 150 supplies a program permission voltage (for example, 0 V) or a program inhibition voltage (for example, Vcc) to the bit lines BLe or BLo in the program operation, and receives the voltages of the bit line BLe or BLo according to data stored in the memory cells F0 to Fn in the read operation, and detects data stored in the memory cells F0 to Fn.

Furthermore, the page buffer group 150 supplies a first program permission voltage (for example, Vcc) to the bit lines BLe and BLo at an early stage of an erase operation and supplies a second program permission voltage (for example, 0 V) to bit lines coupled to the strings ST that have been erased in a program operation, performed according to an erase verify result, during the erase operation. The program permission voltage is determined in response to data latched in each page buffer according to the erase verify result.

The column selector 160 selects page buffers of the page buffer group 150 in response to the column address signal CADD of the control circuit 120. The column selector 160 receives data, outputted from the page buffer group 150 through a column line CL, and transfers the data to the pass/fail determination circuit 180.

The I/O circuit 170 transfers external data DATA to the column selector 160 under the control of the control circuit 120 in order to input the data DATA to the page buffers of the page buffer group 150 in a program operation. When the column selector 160 sequentially transfers the data DATA to each of the page buffers of the page buffer group 150, the page buffers stores the received data in their internal latches. In a read operation, the I/O circuit 170 outputs the data DATA, received from the page buffers of the page buffer group 150 via the column selector 160.

The pass/fail determination circuit 180 checks whether an error cell has occurred in a verify operation performed after a program or erase operation and outputs a result of the check as a check signal PFC. Furthermore, the pass/fail determination circuit 180 counts the number of error cells and outputs a result of the count as a count signal CS.

The control circuit 120 controls the level of a program voltage supplied to a selected word line in a program operation for memory cells and controls the high voltage generation circuit 130 so that verify voltages can be selectively supplied to a selected word line in a program verify operation. The control circuit 120 may control the high voltage generation circuit 130 in response to the check signal CS of the pass/fail determination circuit 180.

Figure 2:
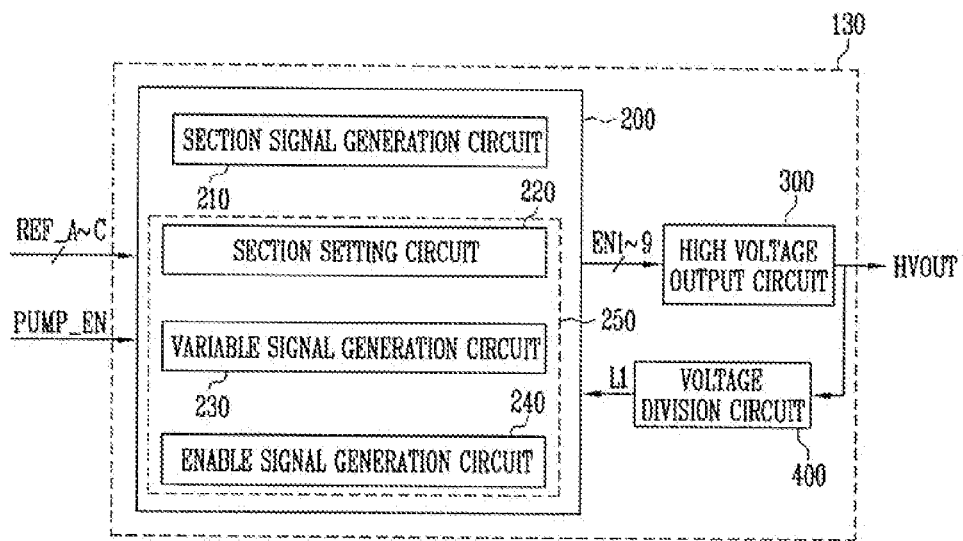
FIG. 2 is a detailed block diagram of an exemplary high voltage generation circuit of FIG. 1.

FIG. 2 is a detailed block diagram of the exemplary high voltage generation circuit 130 of FIG. 1.

Referring to FIG. 2, the high voltage generation circuit 130 includes an enable signal control circuit 200, a high voltage output circuit 300, and a voltage division circuit 400.

The high voltage output circuit 300 includes a plurality of pumps and also switches for connecting the pumps in various configurations. This will be described further with respect to FIG. 7.

The voltage division circuit 400 divides the final pump voltage HVOUT according to a connection of the pumps and outputs a divided voltage L1.

The enable signal control circuit 200 generates section signals by comparing the divided voltage L1 of the voltage division circuit 400 with each of the reference voltages REF_A, REF_B, and REF_C and outputs a plurality of enable signals EN_1 to EN_9 for controlling the switches in the high voltage output circuit 300.

The enable signal control circuit 200 outputs the first to ninth enable signals EN_1 to EN_9 in response to the first to third reference voltages REF_A, REF_B, and REF_C, the pump enable signal PUMP_EN, and the divided voltage L1 of the final pump voltage HVOUT. The enable signal control circuit 200 includes a section signal generation circuit 210 and a section signal combination circuit 250. The section signal combination circuit 250 includes a section setting circuit 220, a variable signal generation circuit 230, and an enable signal generation circuit 240.

The high voltage output circuit 300 includes the plurality of pumps. The high voltage output circuit 300 couples the pumps in a series mode, a parallel mode, or a series/parallel mixed mode in response to the first to ninth enable signals EN_1 to EN_9 of the enable signal control circuit 200, performs a pumping operation, and outputs the final pump voltage HVOUT.

The voltage division circuit 400 divides the final pump voltage HVOUT and feeds back the divided voltage to the enable signal control circuit 200. The voltage division circuit 400 may be implemented, for example, by combining a plurality of resistors. The enable signal control circuit 200 and the high voltage output circuit 300 are described in detail with reference to drawings.

Figure 3:
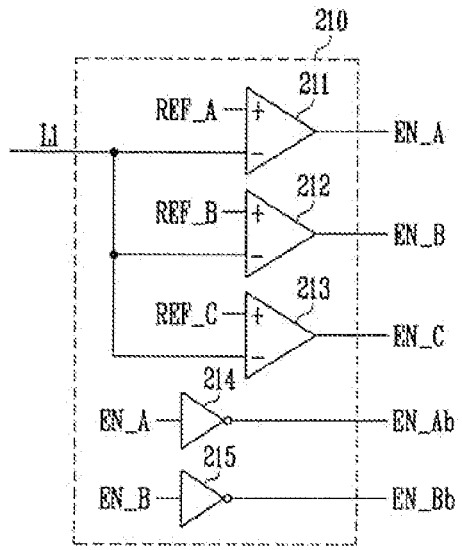
FIG. 3 is a detailed circuit diagram of an exemplary section signal generation circuit of FIG. 2.

FIG. 3 is a detailed circuit diagram of the exemplary section signal generation circuit 210 of FIG. 2.

Referring to FIG. 3, the section signal generation circuit 210 of the enable signal control circuit 200 includes first to third comparators 211, 212, and 213, and first and second inverters 214 and 215.

The first comparator 211 compares the divided voltage L1 with the first reference voltage REF_A, outputs a first section signal EN_A of a high level when the divided voltage L1 is lower than the first reference voltage REF_A as a result of the comparison, and outputs the first section signal EN_A of a low level when the divided voltage L1 is higher than the first reference voltage REF_A as a result of the comparison. For example, the first reference voltage REF_A may be set to 0.8 V. Generally, for the case where a first input is the same as the second input, the output may be either high or low depending on the comparator used and/or implementation.

The second comparator 212 compares the divided voltage L1 with the second reference voltage REF_B higher than the first reference voltage REF_A, outputs a second section signal EN_B of a high level when the divided voltage L1 is lower than the second reference voltage REF_B as a result of the comparison, and outputs the second section signal EN_B of a low level when the divided voltage L1 is higher than the second reference voltage REF_B as a result of the comparison. For example, the second reference voltage REF_B may be set to 0.9 V.

The third comparator 213 compares the divided voltage L1 with the third reference voltage REF_C higher than the second reference voltage REF_B, outputs a third section signal EN_C of a high level when the divided voltage L1 is lower than the third reference voltage REF_C as a result of the comparison, outputs the third section signal EN_C of a low level when the divided voltage L1 is higher than the third reference voltage REF_C as a result of the comparison. For example, the third reference voltage REF_C may be set to 1.0 V.

The first inverter 214 inverts the first section signal EN_A and outputs an inverted first section signal EN_Ab. The second inverter 215 inverts the second section signal EN_B and outputs an inverted second section signal EN_Bb.

Figure 11:
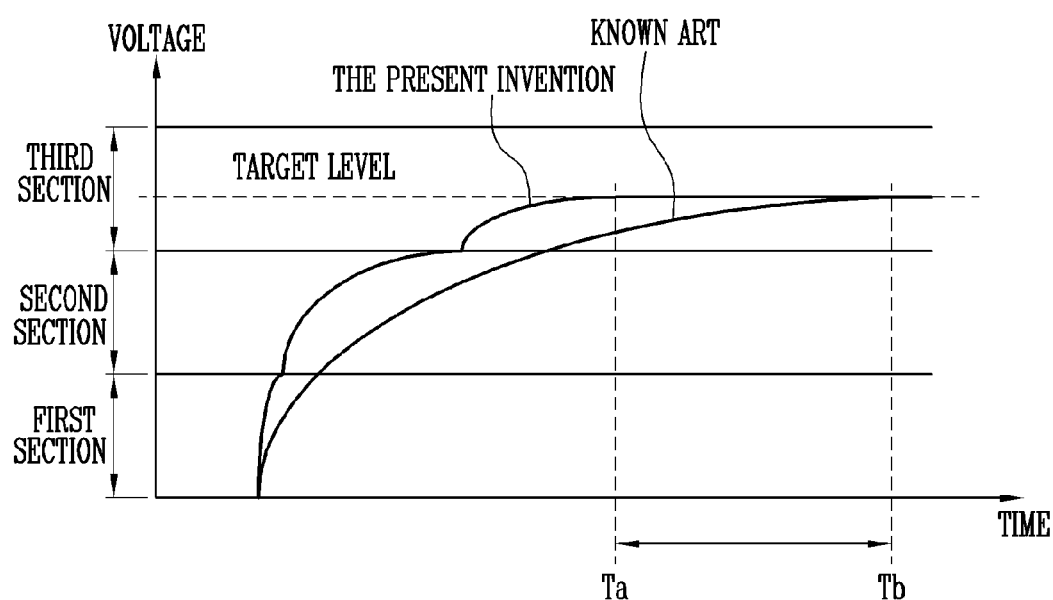
FIG. 11 is a graph illustrating the comparison of output voltages between an embodiment of the invention and a known art.

If a voltage level to be outputted from the high voltage generation circuit 130 are classified into three sections, the voltage level may be classified into a first section that is the lowest section, a second section higher than the first section, and a third section higher than the second section (refer to FIG. 11). The section signals EN_A, EN_B, and EN_C for each section are described with reference to Table 1.

TABLE 1

|  | EN_A | EN_B | EN_C |
| --- | --- | --- | --- |
| First section | H | H | H |
| Second section | L | H | H |
| Third section | L | L | H |

Referring to Table 1, if the output voltage corresponds to the first section, all the first to third section signals EN_A, EN_B, and EN_C become a high level H because the divided voltage L1 is lower than each of the first to third reference voltages REF_A, REF_B, and REF_C.

If the output voltage corresponds to the second section, only the first section signal EN_A becomes a low level L and the second and the third section signals EN_B become a high level H because the divided voltage L1 is lower than the first reference voltage REF_A, but higher than the second and the third reference voltages REF_B and REF_C.

If the output voltage corresponds to the third section, the first and the second section signals EN_A and EN_B become a low level L and the third section signal EN_C becomes a high level H because the divided voltage L1 is lower than the first and the second reference voltages REF_A and REF_B, but higher than the third reference voltage REF_C.

The inverted first section signal EN_Ab is in a low level L when the first section signal EN_A is in a high level H and is in a high level H when the first section signal EN_A is in a low level L. When the second section signal EN_B is in a high level H, the inverted second section signal EN_Bb becomes a low level L. When the second section signal EN_B is in a low level L, the inverted second section signal EN_Bb becomes a high level H. If the output voltage is higher than the third section, all the first to third section signals EN_A, EN_B, and EN_C become a low level L. All the first to ninth switches N1 to N9 (refer to FIG. 7) are turned off, so that a pump operation is stopped.

Figure 4:
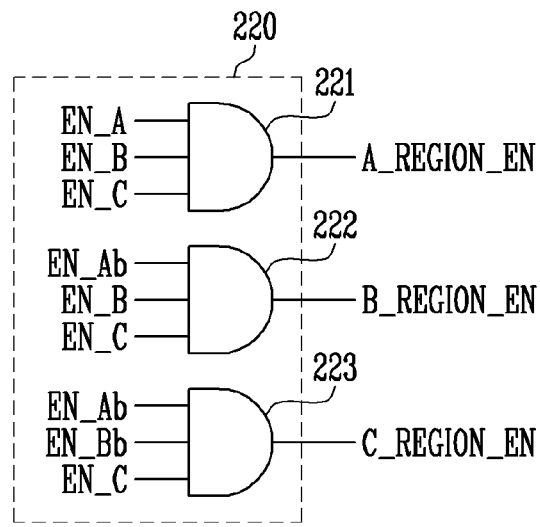
FIG. 4 is a detailed circuit diagram of an exemplary section setting circuit of FIG. 2.

FIG. 4 is a detailed circuit diagram of the exemplary section setting circuit 220 of FIG. 2.

Referring to FIG. 4, the section setting circuit 220 includes first to third AND gates 221, 222, and 223. The first AND gate 221 generates a first section set signal A_REGION_EN in response to the first, the second, and the third section signals EN_A, EN_B, and EN_C. The second AND gate 222 generates a second section set signal B_REGION_EN in response to the inverted first section signal EN_Ab and the second and the third section signals EN_B and EN_C. The third AND gate 223 generates a third section set signal C_REGION_EN in response to the inverted first section signal EN_Ab, the inverted second section signal EN_Bb, and the third section signal EN_C.

TABLE 2

|  | A_REGION_EN | B_REGION_EN | C_REGION_EN |
|---|---|---|---|
| First section | H | L | L |
| Second section | L | H | L |
| Third section | L | L | H |

Referring to Table 2, in the first section, only the first section set signal A_REGION_EN becomes a high level H and the second and the third section set signals B_REGION_EN and C_REGION_EN become a low level L by means of an AND operation because all the first to third section signals EN_A, EN_B, and EN_C are in a high level H (refer to Table 1).

In the second section, only the second section set signal B_REGION_EN becomes a high level H and the first and the third section set signals A_REGION_EN and C_REGION_EN become a low level L by means of an AND operation because the first section signal EN_A is in a low level L and the second and the third section signals EN_B and EN_C are in a high level H (refer to Table 1).

In the third section, only the third section set signal C_REGION_EN becomes a high level H and the first and the second section set signals A_REGION_EN and B_REGION_EN become a low level L by means of an AND operation because the first and the second section signals EN_A and EN_B are in a low level L and the third section signal EN_C is in a high level H (refer to Table 1).

Figure 5:
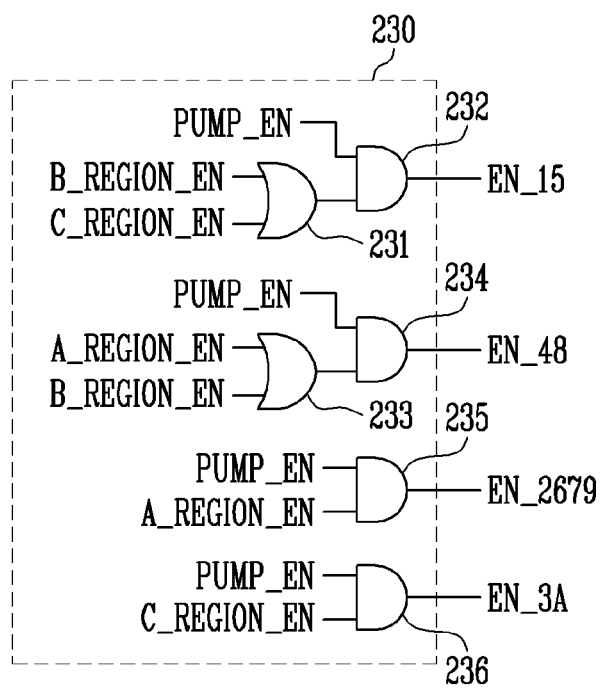
FIG. 5 is a detailed circuit diagram of an exemplary variable signal generation circuit of FIG. 2.

FIG. 5 is a detailed circuit diagram of the exemplary variable signal generation circuit 230 of FIG. 2.

Referring to FIG. 5, the variable signal generation circuit 230 includes first and second OR gates 231 and 233 and fourth to seventh AND gates 232, 234, 235, and 236.

The first OR gate 231 outputs a signal in response to the second and the third section set signals B_REGION_EN and C_REGION_EN. The fourth AND gate 232 generates a first variable signal EN_15 in response to a pump enable signal PUMP_EN and the output signal of the first OR gate 231.

The second OR gate 233 outputs a signal in response to the first and the second section set signals A_REGION_EN and B_REGION_EN. The fifth AND gate 234 generates a second variable signal EN_48 in response to the pump enable signal PUMP_EN and the output signal of the second OR gate 233.

The sixth AND gate 235 generates a third variable signal EN_2679 in response to the pump enable signal PUMP_EN and the first section set signal A_REGION_EN. The seventh AND gate 236 generates a fourth variable signal EN_3A in response to the pump enable signal PUMP_EN and the third section set signal C_REGION_EN. The first to fourth variable signals EN_15, EN_48, EN_2679, and EN_3A for each output voltage are described with reference to Table 3 below.

TABLE 3

|  | EN_15 | EN_48 | EN_2679 | EN_3A |
|---|---|---|---|---|
| First section | L | H | H | L |
| Second section | H | H | L | L |
| Third section | H | L | L | H |

Referring to Table 3, assuming the pump enable signal PUMP_EN is asserted, in the first section, the first and the fourth variable signals EN_15 and EN_3A become a low level L and the second and the third variable signals EN_48 and EN_2679 become a high level H because the first section set signal A_REGION_EN is in a high level H and the second and the third section set signals B_REGION_EN and C_REGION_EN are in a low level L (refer to Table 2).

In the second section, the first and the second variable signals EN_15 and EN_48 become a high level H and the third and the fourth variable signals EN_2679 and EN_3A become a low level L because the second section set signal B_REGION_EN is in a high level H and the first and the third section set signals A_REGION_EN and C_REGION_EN are in a low level L (refer to Table 2).

In the third section, the first and the fourth variable signals EN_15 and EN_3A become a high level H and the second and the third variable signals EN_48 and EN_2679 become a low level L because the first and the second section set signals A_REGION_EN and B_REGION_EN are in a low level L and the third section set signal C_REGION_EN is in a high level H (refer to Table 2).

Figure 6:
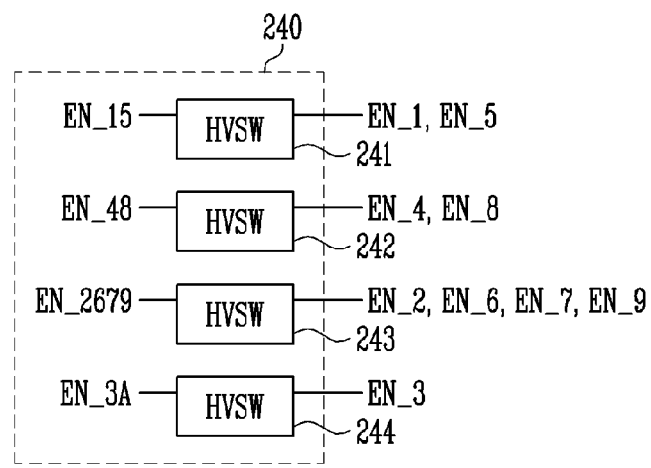
FIG. 6 is a detailed circuit diagram of an exemplary enable signal generation circuit of FIG. 2.

FIG. 6 is a detailed circuit diagram of the exemplary enable signal generation circuit 240 of FIG. 2.

Referring to FIG. 6, the enable signal generation circuit 240 includes first to fourth high voltage switches (HVSW) 241, 242, 243, and 244.

The first high voltage switch 241 outputs the first and the fifth enable signals EN_1 and EN_5 in response to the first variable signal EN_15 where the first enable signal EN_1 and the fifth enable signal EN_5 have the same levels at a given time. For example, when the first variable signal EN_15 is in a high level H, the first high voltage switch 241 outputs the first and the fifth enable signals EN_1 and EN_5 of a high level H. When the first variable signal EN_15 is in a low level L, the first high voltage switch 241 outputs the first and the fifth enable signals EN_1 and EN_5 of a low level L.

The second high voltage switch 242 outputs the fourth and the eighth enable signals EN_4 and EN_8 in response to the second variable signal EN_48.

The third high voltage switch 243 outputs the second, the sixth, the seventh, and the ninth enable signals EN_2, EN_6, EN_7, and EN_9 in response to the third variable signal EN_2679.

The fourth high voltage switch 244 outputs the third enable signal EN_3 in response to the fourth variable signal EN_3A. Like the first high voltage switch 241, each of the second to the fourth high voltage switches 242, 243, and 244 outputs signals of a high level H when a received signal is at a high level H and outputs signals of a low level L when a received signal is at a low level L. The first to ninth enable signals EN_1 to EN_9 for each section of the output voltage are described below with reference to Table 4.

TABLE 4

|  | EN_1 | EN_2 | EN_3 | EN_4 | EN_5 | EN_6 | EN_7 | EN_8 | EN_9 |
|---|---|---|---|---|---|---|---|---|---|
| First section | L | H | L | H | L | H | H | H | H |
| Second section | H | L | L | H | H | L | L | H | L |
| Third section | H | L | H | L | H | L | L | L | L |

Referring to Table 4, in the first section, only the second, the fourth, the sixth, the seventh, the eighth, and the ninth enable signals EN_2, EN_4, EN_6, EN_7, EN_8, and EN_9 become a high level H and the first, the third, and the fifth enable signals EN_1, EN_3, and EN_5 become a low level L because the first and the fourth variable signals EN_15 and EN_3A are in a low level L and the second and the third variable signals EN_48 and EN_2679 are in a high level H (refer to Table 3).

In the second section, only the first, the fourth, the fifth, and the eighth enable signals EN_1, EN_4, EN_5, and EN_8 become a high level H and the second, the third, the sixth, the seventh, and the ninth enable signals EN_2, EN_3, EN_6, EN_7, and EN_9 become a low level L because the first and the second variable signals EN_15 and EN_48 are in a high level H and the third and the fourth variable signals EN_2679 and EN_3A are in a low level L (refer to Table 3).

In the third section, only the first, the third, and the fifth enable signals EN_1, EN_3, and EN_5 become a high level H and the second, the fourth, and the sixth to the ninth enable signals EN_2, EN_4, and EN_6 to EN_9 become a low level L because the first and the fourth variable signals EN_15 and EN_3A are in a high level H and the second and the third variable signals EN_48 and EN_2679 are in a low level L (refer to Table 3).

Figure 7:
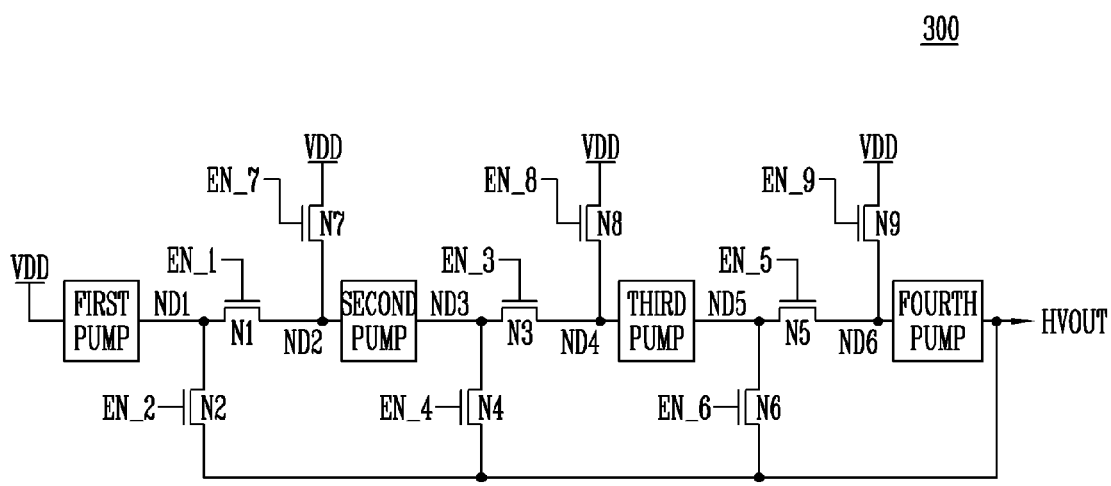
FIG. 7 is a detailed circuit diagram of an exemplary high voltage output circuit of FIG. 2.

FIG. 7 is a detailed circuit diagram of the exemplary high voltage output circuit 300 of FIG. 2.

Referring to FIG. 7, the high voltage output circuit 300 includes first to ninth switches N1 to N9 for connecting first to fourth pumps in a series mode, a parallel mode, or a series/parallel mixed mode.

The first pump performs a pumping operation for raising the level of a power source voltage supplied to a power source voltage terminal VDD and outputs the pumped voltage to the first node ND1. The first switch N1 is coupled between a first node ND1 and a second node ND2. The first switch N1 is turned on when the first enable signal EN_1 is in a high level H, thus coupling the first node ND1 and the second node ND2. That is, when the first switch N1 is turned on, the first pump and the second pump are coupled in series. Accordingly, voltage pumped by the first pump and outputted is supplied to the second pump, and the second pump raises the level of the voltage by pumping the voltage.

The second pump pumps voltage supplied to the second node ND2 and outputs the pumped voltage to a third node ND3. The third switch N3 is coupled between the third node ND3 and the fourth node ND4. The third switch N3 is turned on when the third enable signal EN_3 is in a high level H, thus coupling the third node ND3 and the fourth node ND4. When the third switch N3 is turned on, the second pump and the third pump are coupled in series. Voltage pumped by the second pump and then outputted is supplied to the third pump, and the third pump raises the level of the voltage by pumping the voltage.

The third pump pumps voltage supplied to the fourth node ND4 and outputs the pumped voltage to the fifth node ND5. The fifth switch N5 is coupled between the fifth node ND5 and the sixth node ND6. The fifth switch N5 is turned on when the fifth enable signal EN_5 is in a high level H, thus coupling the fifth node ND5 and the sixth node ND6. When the fifth switch N5 is turned on, the third pump and the fourth pump are coupled in series. Voltage pumped by the third pump and then outputted is supplied to the fourth pump, and the fourth pump raises the level of the voltage by pumping the voltage. The output of the fourth pump is the voltage HVOUT.

The second switch N2 is coupled between the first node ND1 and the high voltage output terminal. When the second enable signal EN_2 is in a high level H, the second switch N2 transfers voltage outputted from the first pump to the high voltage output terminal. The fourth switch N4 is coupled between the third node ND3 and the high voltage output terminal. When the fourth enable signal EN_4 is in a high level H, the fourth switch N4 is turned on, thus transferring voltage outputted from the second pump to the high voltage output terminal. The sixth switch N6 is coupled between the fifth node ND5 and the high voltage output terminal. When the sixth enable signal EN_6 is in a high level H, the sixth switch N6 outputs voltage outputted from the third pump to the high voltage output terminal.

The seventh switch N7 is coupled between the power source voltage terminal VDD and the second node ND2. When the seventh enable signal EN_7 is in a high level H, the seventh switch N7 is turned on, thus transferring the power source voltage to the second pump. The eighth switch N8 is coupled between the power source voltage terminal VDD and the fourth node ND4. When the eighth enable signal EN_8 is in a high level H, the eighth switch N8 is turned on, thus transferring the power source voltage to the third pump. The ninth switch N9 is coupled between the power source voltage terminal VDD and the sixth node ND6. When the ninth enable signal EN_9 is in a high level H, the ninth switch N9 is turned on, thus transferring the power source voltage to the fourth pump.

The high voltage output circuit 300 couples the first to ninth switches N1 to N9, operated in the respective level sections of the output voltage, in a series mode, a parallel mode, or a series/parallel mixed mode.

The operations of the first to ninth switches N1 to N9 for each section of the output voltage are described below with reference to Table 5.

TABLE 5

|  | N1 | N2 | N3 | N4 | N5 | N6 | N7 | N8 | N9 |
| --- | --- | --- | --- | --- | --- | --- | --- | --- | --- |
| First section | OFF | ON | OFF | ON | OFF | ON | ON | ON | ON |
| Second section | ON | OFF | OFF | ON | ON | OFF | OFF | ON | OFF |
| Third section | ON | OFF | ON | OFF | ON | OFF | OFF | OFF | OFF |

Referring to Table 5, in the first section, the second, the fourth, the sixth, the seventh, the eighth, and the ninth switches N2, N4, N6, N7, N8, and N9 are turned on and the first, the third, and the fifth switches N1, N3, and N5 are turned off in response to the second, the fourth, the sixth, the seventh, the eighth, and the ninth enable signals EN_2, EN_4, EN_6, EN_7, EN_8, and EN_9 of a high level H and the first, the third, and the fifth enable signals EN_1, EN_3, and EN_5 of a low level L (refer to Table 4). Accordingly, in the first section, the first to fourth pumps can be coupled in parallel.

In the second section, the first, the fourth, the fifth, and the eighth switches N1, N4, N5, and N8 are turned on and the second, the third, the sixth, the seventh, and the ninth switches N2, N3, N6, N7, and N9 are turned off in response to the first, the fourth, the fifth, and the eighth enable signals EN_1, EN_4, EN_5, and EN_8 of a high level H and the second, the third, the sixth, the seventh, and the ninth enable signals EN_2, EN_3, EN_6, EN_7, and EN_9 of a low level L (refer to Table 4). Accordingly, in the second section, the first and the second pumps may be coupled in series, the third and the fourth pumps may be coupled in series, and a group of the first and the second pumps coupled in series and a group of the third and the fourth pumps coupled in series may be coupled in parallel.

In the third section, the first, the third, and the fifth switches N1, N3, and N5 are turned on and the second, the fourth, the sixth, the seventh, the eighth, and the ninth switches N2, N4, N6, N7, N8, and N9 are turned off in response to the first, the third, and the fifth enable signals EN_1, EN_3, and EN_5 of a high level H and the second, the fourth, the sixth, the seventh, the eighth, and the ninth enable signals EN_2, EN_4, EN_6, EN_7, EN_8, and EN_9 of a low level L (refer to Table 4). Accordingly, in the third section, the first to fourth pumps may be coupled in series.

If the final pump voltage is higher than the third section, all the first to third section signals EN_A, EN_B, and EN_C become a low level L as described above with reference to FIG. 3. Accordingly, all the first to ninth switches N1 to N9 of FIG. 7 are turned off, and thus a pump operation is stopped.

Figure 8:
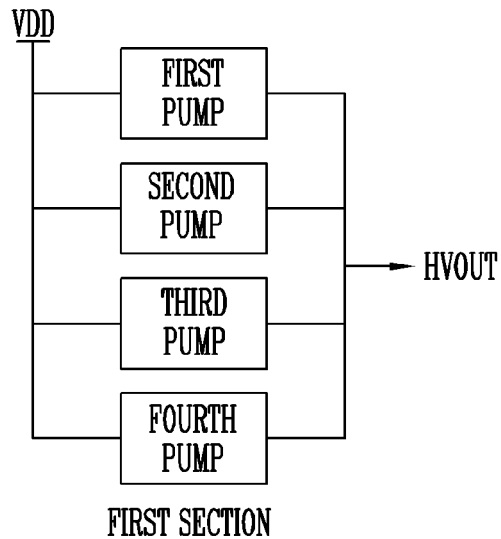
FIGS. 8 to 10 are block diagrams illustrating the construction of an exemplary high voltage output circuit according to the level section of an output voltage.
Figure 9:
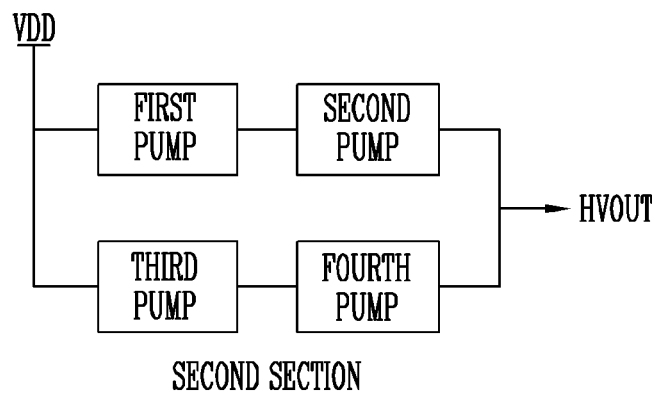
Figure 10:
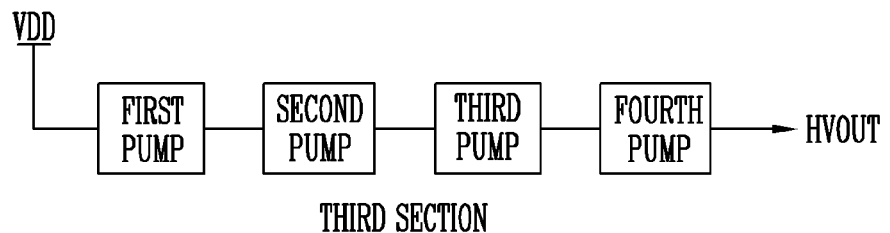

FIGS. 8 to 10 are block diagrams illustrating the construction of the exemplary high voltage output circuit 300 according to the level section of an output voltage.

FIG. 8 is a diagram illustrating the configuration of the pumps in the first section.

Referring to FIG. 8, in the first section, as described above with reference to FIG. 7, the first to fourth pumps are coupled in parallel by controlling the first to ninth switches N1 to N9. When the first to fourth pumps are coupled in parallel, the first to fourth pumps are supplied with the power source voltage at the same time, thus performing pumping operations. Accordingly, the drivability (or current) of the high voltage output circuit 300 is quadrupled compared with the case where the first to fourth pumps are coupled in series.

Referring to FIG. 9, in the second section, as described above with reference to FIG. 7, the first and the second pumps are coupled in series, the third and the fourth pumps are coupled in series, and the first and the second pump group and the third and the fourth pump group are coupled in parallel by controlling the first to ninth switches N1 to N9. In this configuration, the first and the third pumps are supplied with the power source voltage at the same time, thus performing pumping operations. Next, since the second and the fourth pumps perform the pumping operations at the same time, the drivability (or current) of the high voltage output circuit 300 is doubled compared with the case where the first to fourth pumps are coupled in series.

Referring to FIG. 10, in the third section, as described above with reference to FIG. 7, the first to fourth pumps are coupled in series by controlling the first to ninth switches N1 to N9. When the first to fourth pumps are coupled in series, the first to fourth pumps sequentially perform pumping operations.

FIG. 11 is a graph illustrating the comparison of output voltages between an embodiment of the invention and a known art.

Referring to FIG. 11, in the configuration in which the first to fourth pumps are coupled in series as in a known art, the time taken for an output voltage to reach a target level is Tb. In the first section of this disclosure, however, the time taken for an output voltage to reach a target level in the first section can be reduced as compared with the known art because drivability is increased four times. Furthermore, even in the second section, the time taken for an output voltage to reach a target level in the second section can be reduced because the drivability is increase two times. In the third section, since the operating times in the first and the second sections have been reduced, the time taken for an output voltage to reach a final target level can be reduced. That is, in this disclosure, the time taken for an output voltage to reach the final target level is Ta faster than Tb. Accordingly, the time to reach the final voltage can be reduced by 'Tb−Ta'.

As described above, the plurality of pumps is coupled in a series mode, a parallel mode, or a series/parallel mixed mode according to the level of an output voltage. Accordingly, the rising speed of the output voltage can become fast, and the time taken for the high voltage generation circuit to output voltage can be reduced. Accordingly, current consumption can be reduced. It may be noted that the invention need not be limited to the number of switches and/or pumps described in the various figures.

What is claimed:

1. A high voltage generation circuit, comprising:
   a plurality of pumps configured to generate a final pump voltage;
   a plurality of switches configured to couple the pumps in parallel when a target voltage has a first level, in a mixture of series and parallel when the target voltage has a second level higher than the first level, and in series when the target voltage has a third level higher than the second level;
   a voltage division circuit configured to divide the final pump voltage from the pumps interconnected by the switches, and outputting a divided voltage;
   a section signal generation circuit configured to generate a plurality of section signals by comparing the divided voltage with each of different reference voltages; and
   a section signal combination circuit configured to generate enable signals for controlling the switches by combining the section signals.

2. The high voltage generation circuit of claim 1, wherein the section signal generation circuit comprises a plurality of comparators for outputting the respective section signals by comparing the divided voltage with each of the different reference voltages.

3. The high voltage generation circuit of claim 1, wherein the section signal combination circuit comprises:
   a section setting circuit for outputting a plurality of section set signals for setting a section of the final pump voltage in response to the section signals;
   a variable signal generation circuit for generating variable signals for coupling the pumps in series or in parallel in response to the section set signals and a pump enable signal; and
   an enable signal generation circuit for generating the enable signals for controlling the switches to couple the pumps in response to the variable signals.

4. The high voltage generation circuit of claim 3, wherein the section setting circuit comprises a plurality of AND gates for outputting the section set signals by performing an AND operation for the section signals.

5. The high voltage generation circuit of claim 3, wherein the variable signal generation circuit comprises a plurality of OR gates and AND gates for outputting the variable signals for coupling the pumps in series or in parallel in response to the section set signals and the pump enable signal.

6. The high voltage generation circuit of claim 3, wherein the enable signal generation circuit comprises a plurality of high voltage switches for outputting the enable signals in response to the variable signals.

7. A high voltage generation circuit, comprising:
   a high voltage output circuit configured to comprise a plurality of pumps and a plurality of switches for coupling the pumps in parallel when a target voltage has a first level, in a mixture of series and parallel when the target voltage has a second level higher than the first level, and in series when the target voltage has a third level higher than the second level;

a voltage division circuit configured to divide a final pump voltage of the pumps and output a divided voltage; and an enable signal control circuit configured to compare the divided voltage with each of a first reference voltage, a second reference voltage higher than the first reference voltage, and a third reference voltage higher than the second reference voltage and to generate a first group of enable signals, a second group of enable signals, or a third group of enable signals for controlling the switches according to a combination of signals generated as a result of the comparison.

8. The high voltage generation circuit of claim 7, wherein the high voltage output circuit comprises:

a first pump for pumping a power source voltage supplied to a power source voltage terminal and outputting the pumped voltage to a first node;

a first switch for transferring the voltage of the first node to a second node in response to a first enable signal;

a second pump for pumping the voltage of the second node and outputting the pumped voltage to a third node;

a third switch for transferring the voltage of the third node to a fourth node in response to a third enable signal;

a third pump for pumping the voltage of the fourth node and outputting the pumped voltage to a fifth node;

a fifth switch for transferring the voltage of the fifth node to a sixth node in response to a fifth enable signal;

a fourth pump for pumping the voltage of the sixth node and outputting the pumped voltage to a high voltage output terminal;

a second switch for transferring the voltage of the first node to the high voltage output terminal in response to a second enable signal;

a fourth switch for transferring the voltage of the third node to the high voltage output terminal in response to a fourth enable signal;

a sixth switch for transferring the voltage of the fifth node to the high voltage output terminal in response to a sixth enable signal;

a seventh switch for coupling the power source voltage terminal and the second node in response to a seventh enable signal;

an eighth switch for coupling the power source voltage terminal and the fourth node in response to an eighth enable signal; and a ninth switch for coupling the power source voltage terminal and the sixth node in response to a ninth enable signal.

9. The high voltage generation circuit of claim 7, wherein the enable signal control circuit comprises:

a section signal generation circuit for generating a first section signal, a second section signal, a third section signal, an inverted first section signal, and an inverted second section signal by comparing the first to third reference voltages with the divided voltage;

a section setting circuit for generating a first section set signal, a second section set signal and a third section set signal in response to the first section signal, the second section signal, the third section signal, the inverted first section signal, and the inverted second section signal;

a variable signal generation circuit for generating a first variable signal, a second variable signal, a third variable signal, and a fourth variable signal in response to the first section set signal, the second section set signal, the third section set signal, and a pump enable signal; and an enable signal generation circuit for generating the first group of enable signals, the second group of enable signals, the third group of enable signals, and the fourth group of enable signals in response to the first variable signal, the second variable signal, the third variable signal, and the fourth variable signal.

10. The high voltage generation circuit of claim 9, wherein the section signal generation circuit comprises:

a first comparator for generating the first section signal by comparing the first reference voltage with the divided voltage;

a second comparator for generating the second section signal by comparing the second reference voltage with the divided voltage;

a third comparator for generating the third section signal by comparing the third reference voltage with the divided voltage;

a first inverter for generating the inverted first section signal by inverting an output signal of the first comparator; and a second inverter for generating the inverted second section signal by inverting an output signal of the second comparator.

11. The high voltage generation circuit of claim 10, wherein:

the first comparator generates the first section signal of a high level when the divided voltage is lower than the first reference voltage and generates the first section signal of a low level when the divided voltage is higher than the first reference voltage, the second comparator generates the second section signal of a high level when the divided voltage is lower than the second reference voltage and generates the second section signal of a low level when the divided voltage is higher than the second reference voltage, and the third comparator generates the third section signal of a high level when the divided voltage is lower than the third reference voltage and generates the third section signal of a low level when the divided voltage is higher than the third reference voltage.

12. The high voltage generation circuit of claim 9, wherein the section setting circuit comprises:

a first AND gate for generating the first section set signal in response to the first section signal, the second section signal, and the third section signal;

a second AND gate for generating the second section set signal in response to the inverted first section signal, the second section signal, and the third section signal; and a third AND gate for generating the third section set signal in response to the inverted first section signal, the inverted second section signal, and the third section signal.

13. The high voltage generation circuit of claim 9, wherein the variable signal generation circuit comprises:

a first OR gate for generating a first signal in response to the second section set signal and the third section set signal;

a fourth AND gate for generating the first variable signal in response to the first signal and the pump enable signal;

a second OR gate for generating a second signal in response to the first section set signal and the second section set signal;

a fifth AND gate for generating the second variable signal in response to the second signal and the pump enable signal;

a sixth AND gate for generating the third variable signal in response to the first section set signal and the pump enable signal; and a seventh AND gate for generating the fourth variable signal in response to the third section set signal and the pump enable signal.

14. The high voltage generation circuit of claim 9, wherein the enable signal generation circuit comprises high voltage switches for generating the first group of enable signals, the second group of enable signals, the third group of enable signals, and the fourth group of enable signals in response to the first to fourth variable signals.

15. A semiconductor device, comprising:
a memory cell array configured to store data;
a row decoder coupled to word lines of the memory cell array;
a high voltage generation circuit configured to couple a plurality of pumps in parallel when a target voltage has a first level, in a mixture of series and parallel when the target voltage has a second level higher than the first level, and in series when the target voltage has a third level higher than the second level according to a level of a divided voltage obtained by dividing a final pump voltage of the plurality of pumps and output an output voltage to the row decoder;
page buffers coupled to bit lines of the memory cell array;
a column selector configured to select the page buffers;
an I/O circuit configured to transfer data to the column selector and to externally output received data; and
a control circuit configured to control the high voltage generation circuit, the page buffers, the column selector, and the I/O circuit.

16. The semiconductor device of claim 15, wherein the high voltage generation circuit comprises:
an enable signal control circuit for comparing each of a first reference voltage outputted from the control circuit, a second reference voltage higher than the first reference voltage outputted from the control circuit, and a third reference voltage higher than the second reference voltage outputted from the control circuit with the divided voltage, generating a first group of switch configuration when the divided voltage is lower than the first reference voltage, generating a second group of switch configuration signals when the divided voltage is between the first reference voltage and the second reference voltage, and generating a third group of switch configuration signals when the divided voltage is between the second reference voltage and the third reference voltage;
a high voltage output circuit for outputting a high voltage by coupling the pumps in a parallel mode in response to the first group of switch configuration signals, coupling the pumps in a series/parallel mixed mode in response to the second group of switch configuration signals, and coupling the pumps in a series mode in response to the third group of switch configuration signals, and
a voltage division circuit for generating the divided voltage by dividing the high voltage outputted from the high voltage output circuit.

17. The semiconductor device of claim 16, wherein the enable signal control circuit comprises:
a section signal generation circuit for generating a first section signal, a second section signal, a third section signal, an inverted first section signal, and an inverted second section signal by comparing the first to third reference voltages with the divided voltage;
a section setting circuit for generating a first section set signal, a second section set signal, and a third section set signal in response to the first section signal, the second section signal, the third section signal, the inverted first section signal, and the inverted second section signal;
a variable signal generation circuit for generating a first variable signal, a second variable signal, a third variable signal, and a fourth variable signal in response to the first section set signal, the second section set signal, the third section set signal, and a pump enable signal; and
an enable signal generation circuit for generating the first group of enable signals, the second group of enable signals, the third group of enable signals, and a fourth group of enable signals in response to the first variable signal, the second variable signal, the third variable signal, and the fourth variable signal.

18. The semiconductor device of claim 17, wherein the section signal generation circuit comprises:
a first comparator for generating the first section signal by comparing the first reference voltage with the divided voltage;
a second comparator for generating the second section signal by comparing the second reference voltage with the divided voltage;
a third comparator for generating the third section signal by comparing the third reference voltage with the divided voltage;
a first inverter for generating the inverted first section signal by inverting an output signal of the first comparator; and
a second inverter for generating the inverted second section signal by inverting an output signal of the second comparator.

19. The semiconductor device of claim 18, wherein:
the first comparator generates the first section signal of a high level when the divided voltage is lower than the first reference voltage and generates the first section signal of a low level when the divided voltage is higher than the first reference voltage,
the second comparator generates the second section signal of a high level when the divided voltage is lower than the second reference voltage and generates the second section signal of a low level when the divided voltage is higher than the second reference voltage, and
the third comparator generates the third section signal of a high level when the divided voltage is lower than the third reference voltage and generates the third section signal of a low level when the divided voltage is higher than the third reference voltage.

20. The semiconductor device of claim 17, wherein the section setting circuit comprises:
a first AND gate for generating the first section set signal in response to the first section signal, the second section signal, and the third section signal;
a second AND gate for generating the second section set signal in response to the inverted first section signal, the second section signal, and the third section signal; and
a third AND gate for generating the third section set signal in response to the inverted first section signal, the inverted second section signal, and the third section signal.

21. The semiconductor device of claim 17, wherein the variable signal generation circuit comprises:
a first OR gate for generating a first signal in response to the second section set signal and the third section set signal;
a fourth AND gate for generating the first variable signal in response to the first signal and the pump enable signal;
a second OR gate for generating a second signal in response to the first section set signal and the second section set signal;

a fifth AND gate for generating the second variable signal in response to the second signal and the pump enable signal;

a sixth AND gate for generating the third variable signal in response to the first section set signal and the pump enable signal; and a seventh AND gate for generating the fourth variable signal in response to the third section set signal and the pump enable signal.

22. The semiconductor device of claim 17, wherein the enable signal generation circuit comprises high voltage switches for generating the first group of enable signals, the second group of enable signals, the third group of enable signals, and the fourth group of enable signals in response to the first to fourth variable signals.

23. The semiconductor device of claim 16, wherein the high voltage output circuit comprises:

a first pump for pumping a power source voltage supplied to a power source voltage terminal and outputting the pumped voltage to a first node;

a first switch for transferring the voltage of the first node to a second node in response to a first enable signal;

a second pump for pumping the voltage of the second node and outputting the pumped voltage to a third node;

a third switch for transferring the voltage of the third node to a fourth node in response to a third enable signal;

a third pump for pumping the voltage of the fourth node and outputting the pumped voltage to a fifth node;

a fifth switch for transferring the voltage of the fifth node to a sixth node in response to a fifth enable signal;

a fourth pump for pumping the voltage of the sixth node and outputting the pumped voltage to a high voltage output terminal;

a second switch for transferring the voltage of the first node to the high voltage output terminal in response to a second enable signal;

a fourth switch for transferring the voltage of the third node to the high voltage output terminal in response to a fourth enable signal;

a sixth switch for transferring the voltage of the fifth node to the high voltage output terminal in response to a sixth enable signal;

a seventh switch for coupling the power source voltage terminal and the second node in response to a seventh enable signal;

an eighth switch for coupling the power source voltage terminal and the fourth node in response to an eighth enable signal; and a ninth switch for coupling the power source voltage terminal and the sixth node in response to a ninth enable signal.

24. The semiconductor device of claim 23, wherein the first group of enable signals comprises the first enable signal of a low level, the second enable signal of a high level, the third enable signal of a low level, the fourth enable signal of a high level, the fifth enable signal of a low level, the sixth enable signal of a high level, the seventh enable signal of a high level, the eighth enable signal of a high level, and the ninth enable signal of a high level.

25. The semiconductor device of claim 23, wherein the second group of enable signals comprises the first enable signal of a high level, the second enable signal of a low level, the third enable signal of a low level, the fourth enable signal of a high level, the fifth enable signal of a high level, the sixth enable signal of a low level, the seventh enable signal of a low level, the eighth enable signal of a high level, and the ninth enable signal of a low level.

26. The semiconductor device of claim 23, wherein the third group of enable signals comprises the first enable signal of a high level, the second enable signal of a low level, the third enable signal of a high level, the fourth enable signal of a low level, the fifth enable signal of a high level, the sixth enable signal of a low level, the seventh enable signal of a low level, the eighth enable signal of a low level, and the ninth enable signal of a low level.

* * * * *